(12) United States Patent
    Buckley et al.

(10) Patent No.: US 9,112,492 B2
(45) Date of Patent: Aug. 18, 2015

(54) NON-VOLATILE ELECTRONIC LOGIC MODULE

(71) Applicant: Commissariat à l' énergie atomique et aux énergies alternatives, Paris (FR)

(72) Inventors: Julien Buckley, Grenoble (FR); Haykel Ben Jamaa, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/956,796

(22) Filed: Aug. 1, 2013

(65) Prior Publication Data

US 2015/0035560 A1    Feb. 5, 2015

(51) Int. Cl.
    *H03K 19/173*    (2006.01)
    *H03K 19/007*    (2006.01)
    *H03K 19/177*    (2006.01)

(52) U.S. Cl.
    CPC ........ *H03K 19/007* (2013.01); *H03K 19/17724* (2013.01)

(58) Field of Classification Search
    None
    See application file for complete search history.

(56) References Cited

U.S. PATENT DOCUMENTS

2009/0243653 A1    10/2009  Inokuchi et al.
2011/0280073 A1*   11/2011  Chiu et al. ............... 365/185.08

* cited by examiner

*Primary Examiner* — Jany Richardson
(74) *Attorney, Agent, or Firm* — Pillsbury Winthrop Shaw Pittman LLP

(57) ABSTRACT

A logic module includes a device for implementing a logic function the device including at least one input and at least one output, the output at least partially representing the result of the logic function; at least one first element including at least one resistance state, at least one second element formed by a bipolar resistive memory; the first element and the second element having a common electrode connected to the output.

8 Claims, 5 Drawing Sheets

NON-VOLATILE ELECTRONIC LOGIC MODULE

FIELD

This invention relates to a logic module integrating a logic circuit that performs a combinational or sequential type of logic function, with a non-volatile module to save the value calculated by the logic module.

BACKGROUND

In a known manner, a logic module is a device that performs a logic function and usually comprises several inputs and one or several outputs, each output being obtained by performing one or several binary logic operations on the inputs. A distinction can be made between "combinational" logic functions on which boolean calculations are based, resulting from a combinational analysis of variations of input magnitudes only, and "sequential" logic functions or toggles resulting from the association of several "combinational" logic functions for which there must be a "clock" that sets the rhythm; output values depend not only on input values, but also on the time at which they are measured (before or after clock synchronisation).

It should be noted that when an input data is modified, the output reacts immediately, except for the propagation time. This specific feature has disadvantages. The output data are lost when a power supply failure occurs. This power supply failure may be accidental, but it may also be deliberate so as to reduce the global consumption of the circuit.

SUMMARY

An aspect of the invention provides a logic module capable of saving and restoring signals after a power supply cut. Another aspect of the invention provides a low consumption logic module.

To achieve this, an embodiment of the invention relates to a logic module comprising:
  a device for implementing a logic function, the device comprising at least one input and at least one output, the at least one output at least partially representing the results of the logic function;
  at least one first element comprising at least one resistance state,
  at least one second element formed by a bipolar resistive memory;
  the first element and the second element having a common electrode connected to said output.

In the remainder of the description, a bipolar resistive memory (or bipolar memory point) means a memory with a bipolar operation during which a first voltage may be applied to it to change from a high resistance OFF state to a low resistive ON state, and a second voltage may be applied to it with a polarity different from the polarity of the first voltage, to change from the low resistive ON state to the high resistance OFF state. For example, this memory is a bipolar RRAM (resistive RAM) memory such as CBRAM (Conductive Bridge Random Access Memory) ion conductive bridge memories.

According to an embodiment of the invention, when there is a power supply failure in the logic module, previously saved signals on at least the first element having an electrode common with the second element are stored such that the previously saved signals can be restored when the logic module is powered up. This power supply, cut may be accidental but it may also be deliberate to reduce the global consumption of the circuit included in such a module while being capable of restoring saved signals.

The second element may itself be a ohmic resistive element (i.e. a ohmic resistance or a transistor in resistive mode) or a bipolar resistive memory such as a bipolar RRAM (Resistive RAM).

Depending on the voltages applied to the non-common electrodes of the first and the second element connected to the output, the logic module may be used in different operating modes:
  an inactive mode during which the bipolar resistive memory is highly resistive so that it does not disturb implementation of the logic function;
  a save mode during which the output signal from the logic module is saved according to a particular resistive configuration of the first or second element;
  a restore mode during which the saved signal is restored to said output from the logic module.

The logic module according to an embodiment of the invention may also have one or several of the following characteristics, considered individually or in any technically feasible combination:
  the first element is a ohmic resistance or a transistor;
  the first element is a bipolar resistive memory, the first element and said second element being arranged in series and with the same polarity sens;
  voltages applied to the corresponding non-common electrodes of said first and second elements are programmed according to one or several clock cycles such that the logic module has three operating modes:
    an inactive mode during which the first element and the second element are in a high resistance state named high resistance state, such that said first and second elements do not disturb use of the logic function;
    a save mode during which the most recent result of the logic function is saved as a function of a given resistance state of said first and second elements;
    a restore mode following the save mode during which the most recently saved result is restored on said output;
  each bipolar resistive memory is chosen from among the following memory types:
    CBRAM memory;
    bipolar OxRAM memory;
    MEMS memory;
    NEMS memory.
  the first element and the second element are placed between a first metallisation level and a second metallisation level, the first metallisation level being the lowest metallisation level.
  In a non-limitative embodiment:
  the electrode of the first element different from the common electrode is connected to the first metallisation level, the first metallisation level forming the input to the MVDD power supply line;
  the electrode of the second element different from said common electrode is connected to the first metallisation level, the first metallisation level forming the input to the MVSS power supply line, and
  the output is formed by the first metallisation level.
  In a different and also non-limitative embodiment:
  the electrode of the first element different from the common electrode is connected to the second metallisation level, the second metallisation level forming the input to the MVDD power supply line;

the electrode of the second element different from the common electrode is connected to the second metallisation level, the second metallisation level forming the input to the MVSS power supply line; and the output is formed by the second metallisation level and is connected to the common electrode.

In another non-limitative embodiment, the first element and the second element are located between two intermediate or higher metallisation levels.

In one non-limitative embodiment of the invention, the logic module comprises:
a plurality of outputs, the plurality of outputs representing the result of the logic function;
a plurality of first elements;
a plurality of second elements;
each output being connected to a common electrode of a first element and of a second element.

BRIEF DESCRIPTION OF THE FIGURES

Other characteristics and benefits of the invention will become clear from the description given for guidance below and that is in no way limitative, with reference to the attached appended figures among which.

For reasons of clarity, only essential elements for understanding the invention have been shown, diagrammatically and not to scale.

DETAILED DESCRIPTION

Figure 1:
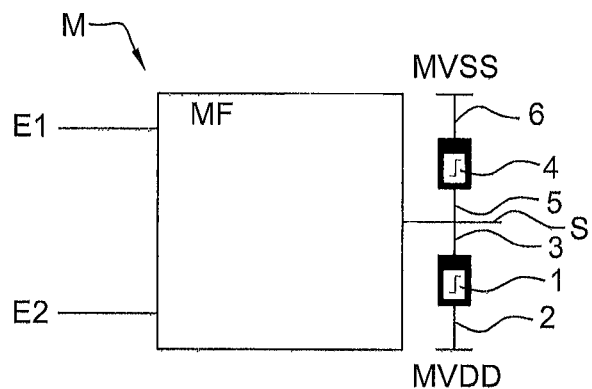
FIG. 1 diagrammatically illustrates a a logic module according to an embodiment of the invention.

FIG. 1 illustrates a first embodiment of a logic module M according to the invention.

The logic module M comprises:
a device for implementing a logic function MF, the device MF comprising two inputs E1, E2 and a single output S representing the result of the logic function;
a first element 1 formed by a bipolar resistive memory comprising a first electrode 2 and a second electrode 3, and
a second element 4 formed by a bipolar resistive memory comprising a third electrode 5 and a fourth electrode 6.

It should be noted that the device for implementing a logic function MF form a, logic circuit performing a logic function; the number of inputs has been given solely for illustrative purposes, it being understood that the module may have only a single input (for example the case of an inverter) or more than two inputs. Non-limitatively, the device for implementing a logic function MF are formed using a CMOS (Complementary Metal Oxide Semiconductor) type technology.

The first element 1 and the second element are non-volatile memories that maintain their resistance state (state that represents a memory state) if there is no electrical power supply.

Furthermore, the first element 1 and the second element 4 have a common electrode formed by the second electrode 3 and the third electrode 5; the common second electrode 3 and third electrode 5 are also connected to an output S from the module MF. It should be noted that the first element 1 and the second element 4 are arranged in series, with the same polarity sens.

Each element with bipolar resistive switching may be formed by a bipolar RRAM (Resistive Random Access Memory) of the CBRAM (Conductive Bridge Random Access Memory) type or the bipolar OxRAM (Oxide Random Access Memory) type; OxRAM memories may be bipolar or unipolar depending on the technologies used; only bipolar QxRAMs can be used with the invention.

In general, an RRAM memory is said to use bipolar resistive switching if the polarity of its SET voltage to change from a high resistance state to a low resistance state is opposite to the polarity of its RESET voltage to change from the low resistance state to the high resistance state, such that the two states cannot be programmed with the same polarity.

For illustration purposes, the operation of CBRAM type devices is based on the formation of one or several metallic filaments (also called dendrites) between two electrodes in a solid electrolyte, when these electrodes are brought to appropriate corresponding potentials. Formation of the filament can create a given electrical conduction between the two electrodes. The corresponding potentials applied to the electrodes can be modified to modify the distribution of the filament, and thus to modify the electrical conduction between the two electrodes. For example, by inverting the potential between the electrodes, the metallic filament can be eliminated or reduced, so as to eliminate or considerably reduce electrical conduction due to the presence of the filament. CBRAM devices may thus operate in two states: a so-called ON state and a so-called "OFF" state, and thus act as memory cells. The CBRAM device is formed from a metal/ion conductor/metal type stack and comprises a solid electrolyte, for example based on doped calcogenide such as GeS located between an inert electrode for example made of Pt and a soluble electrode comprising a portion of ionisable metal, for example based on Ag or Cu, in other words a portion of metal that can easily form metal ions (in this case $Ag^+$ or $Cu^{2+}$ silver ions). The memory state of a CBRAM memory device is the result of the difference in electrical resistivity between two states (ON and OFF). In the OFF state, metal ions (for example in this case Ag+ ions for a soluble Ag electrode) originating from the portion of ionisable metal are dispersed in the entire solid electrolyte. Thus, there is no electrical contact between the portion of ionisable metal and the inert electrode. The solid electrolyte forms a high resistivity electrically insulating zone between the anode and the cathode.

When a positive potential V is applied to the soluble electrode, a redox reaction takes place at this electrode, thus creating mobile ions.

The following reaction takes place in the case of a silver electrode:

To achieve this, potential V applied to the soluble electrode must be greater than the redox potential of the electrode concerned (usually of the order of several hundred mV).

Ions then displace in the electrolyte under the effect of the applied electrical field. The displacement velocity depends on the mobility of the ion in the electrolyte concerned, which guides the choice of the soluble electrode/electrolyte pair (for example Ag/GeS, Cu/SiO2, etc.). Displacement velocities of the ions are of the order of one nm/ns.

Once the ions have reached the inert electrode, they are reduced due to the presence of electrons provided by the electrode, causing the growth of a metallic filament according to the following reaction:

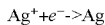

This filament preferentially grows in the direction of the soluble electrode.

The memory then changes to the ON state when the filament enables contact between the two electrodes, making the stack conducting. This phase is called the memory SET phase.

A negative voltage V is applied to the soluble electrode to change to the OFF state (memory RESET phase), causing dissolution of the conducting filament. Thermal mechanisms (temperature rise) and redox mechanisms are usually invoked to justify this dissolution.

According to an embodiment of the invention, the first CBRAM element 1 and the second CBRAM element 4 are arranged in series and with the same polarity sens, the inert electrode of the first element 1 will therefore be connected to the soluble electrode of the second element 4, this common point itself being connected to the output S.

Figure 2:
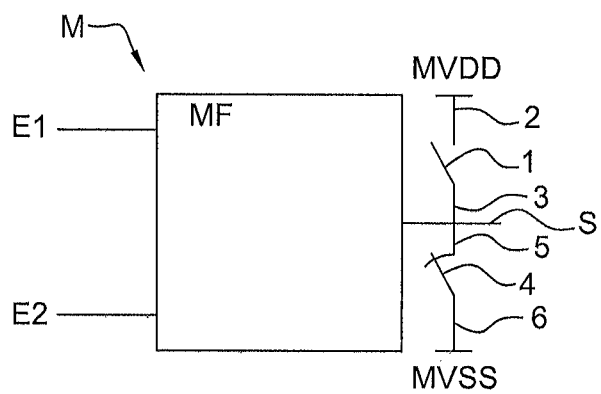
FIG. 2 diagrammatically illustrates a a logic module according to an embodiment of the invention.

In a second particular embodiment of the invention illustrated in FIG. 2, the first element 1 is formed from a NEMS (Nano Electra-Mechanical Systems) or MEMS (Micro Electra Mechanical Systems) bipolar switch type resistive memory, and the second element 4 is also formed from a bipolar NEMS or MEMS switch type resistive memory.

A NEMS or MEMS memory is said to be a bipolar resistive switching memory if the polarity of its SET voltage to change from a high resistance state to a low resistance state is opposite to the polarity of its RESET voltage to change from the low resistance state to the high resistance state, such that the two states cannot be programmed with the same polarity.

In the case of NEMS/MEMS switches, bipolarity is achieved by the use of a strip that can be brought into contact with an electrode when the applied voltage between the strip and the electrode is greater than a threshold voltage thus reducing the resistance between this strip and the electrode to almost zero. When this voltage is less than the threshold voltage, the strip detaches from the electrode and the resistance between the strip and the electrode is almost infinite.

In general and in the two embodiments mentioned above and illustrated in FIGS. 1 and 2, it should be noted that the voltages applied on the corresponding non-common electrodes (composed of the first electrode 2 and the fourth electrode 6 of the first and second elements 1 and 4 are programmed over one or several clock cycles such that the logic module M has three operating modes:

an inactive mode during which the first element 1 and the second element 4 are in a high resistance state, called the high resistance OFF state, such that said first and second elements 1 and 4 do not disturb use of the logic function;

a save mode during which the most recent result of the logic function is saved as a function of a given resistance state of the first element 1 and second element 4;

a restore mode usually following the save mode during which the most recently saved result is restored on output S;

For simplification reasons, in the following we have considered RRAM memories with identical characteristics, but it should be clearly understood that an embodiment of the invention is equally applicable to bipolar resistive memories that do not necessarily have identical characteristics.

The following conditions may be defined to obtain these three operating modes (inactive, save and restore):

a reference voltage $V_{DD}$ is defined, this reference voltage being for example between 0.6 V and 1.2 V so as to be compatible with the CMOS technology that can be used to form a device for using a logic function MF;

$0.5 \times V_{DD} > |V_{ON}|$, $V_{ON}$ such that the first and second bipolar resistive switching elements 1, 4 can be in a low resistive ON state (SET voltage generating a resistance $R_{ON}$);

$0.5 \times V_{DD} > |V_{OFF}|$, $V_{OFF}$ such that the first and second bipolar resistive switching elements 1, 4 can be in a high resistance OFF state (RESET voltage generating a resistance $R_{OFF}$);

$(R_{OFF}/R_{ON}) > 10^3$ or $10^4$. The ratio $(R_{OFF}/R_{ON})$ can also be greater than 100 or even 10 without going outside the scope of the invention. $R_{ON}$ may be of the order of 1 kΩ. In the case of NEMS type switches, this resistance $R_{ON}$ may be of the order of 1 kΩ. It should be noted also that the logic module M becomes faster as the value $R_{ON}$ becomes smaller. The lower limiting value of the $R_{OFF}/R_{ON}$ ratio is given by the margin at the input to the logic module M. If the margin on this module is q=25%, then it is sufficient to use $(R_{OFF}/R_{ON}) \geq 1/q = 1/0.2\ 5 = 4$. It is desirable that $(R_{OFF}/R_{ON})$ should be the maximum possible value because a low ratio means high leaks and/or a slower logic module. This condition guarantees operation of the restore mode.

The following conditions may also be defined:

$$R_{ON}/R_{T,ON} > |V_{OFF}|/(0.5 \times V_{DD} - |V_{OFF}|), \text{ and}$$

$$R_{ON}/R_{T,ON} > |V_{ON}|/(0.5 \times V_{DD} - |V_{ON}|);$$

in which $R_{T,ON}$ is the resistance of transistors used in the CMOS technology in the conducting state.

These two final conditions facilitate operation of save mode.

In a first embodiment, the resistive value $R_{ON}$ of the first bipolar resistive switching element 1 is equal to the resistive value $R_{ON}$ of the second bipolar resistive switching element 4. In this case, the logic module M is symmetric.

In a second embodiment, the logic module M is asymmetric such that the resistive value $R_{ON}$ of the first bipolar resistive switching element 1 is not the same as the resistive value $R_{ON}$ of the second bipolar resistive switching element 4. In this case, the chosen resistance $R_{ON}$ will be the greatest among the two elements 1 and 4.

An embodiment of the invention also relates to a method of controlling the operating mode of a logic module M conforming with the modes illustrated in FIGS. 1 and 2, so as to change from one operating mode to another. The sequence of operations is illustrated by the method 100a in FIG. 3; the method 100a thus comprises a first step 101a in which inactive mode is used, during which the first element 2 and the second element 4 are in a high resistance state, such that the first and second elements 1 and 4 do not disturb use of the logic function. To achieve this:

a first clock cycle is triggered during which the voltage MVDD applied to the electrode 2 of the first element 1 different from the common electrode (formed by electrodes 3 and 5) is equal to 1.5 times the reference voltage VDD and the voltage MVSS applied to the electrode 6 of the second element 4 different from the common electrode (formed by the electrodes 3 and 5) is equal to 0.5 times the reference voltage VDD;

a second clock cycle is triggered during which the voltage MVDD is equal to 0.5 times the reference voltage VDD and the voltage MVSS is equal to −0.5 times the reference voltage VDD, and then optionally, a third clock cycle is triggered during which:
the voltage MVDD is equal to the reference voltage VDD and the voltage MVSS is equal to 0, or
the voltage MVDD and the voltage MVSS are floating.

These three clock cycles assure that the first and second elements 1 and 4 are highly resistive (i.e. regardless of the value of the output S), and therefore do not slow operation of the logic module M. Thus, during this inactive operating mode, the logic module M can function conventionally and perform logic operations without being affected by excessively low values of the resistances of memories 1 and 4.

A larger number of clock cycles may be desirable so that the resistances of the first element 1 and of the second element 4 are high. The desired number of cycles is then determined statically (by a statistical study of the activity ratio of all logic modules M in the circuit in which the logic module concerned is located) or by monitoring the current that passes through the bipolar resistive switching elements 1 and 4. As long as there is a current passing through one of the bipolar resistive switching elements 1 or 4 after a clock cycle, it is known that at least one of the bipolar resistive switching elements 1 or 4 is not highly resistive. In this case, an additional clock cycle should be triggered.

Figure 3:
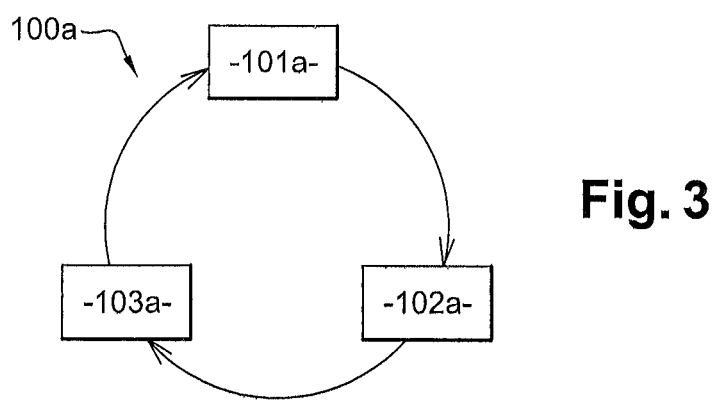
FIG. 3 illustrates a block diagram of steps in a method of controlling the operating mode of a logic module according to that illustrated in FIG. 1 or FIG. 2.

The method 100a illustrated in FIG. 3 also comprises a second step 102a to implement save mode during which specific polarities are applied to the non-common electrodes 3, 5 of the first element 1 and the second element 4 so that the most recent result of the logic function is saved. In an embodiment, this step is triggered when it is required to switch the module power supply off and therefore stop the logic calculations performed by the logic module.

During this second step 102a, the voltage MVDD applied to the non-common electrode 2 of the first element 1 is equal to 0.5 times the reference voltage VDD and the voltage MVSS applied to the non-common electrode 6 of the second element 4 is equal to 0.5 times the reference voltage VDD.

A determined period is also desired to make sure that the save takes place, after which the logic module M is switched off. This determined period is equal to the minimum time to write on a bipolar resistive switching element, this minimum time for example being more than 10 microseconds.

In general, save mode allows bipolar resistive switching elements 1 and 4 to change the resistance state as a function of the output. Therefore, bipolar resistive switching elements 1 and 4 follow operation of the logic module M.

As soon as the save is complete, the power supply to the first and second elements 1 and 4 of the MF module can be switched off.

For example, if the output S to be saved is equal to a logical 1 (in other words a potential approximately equal to VDD on S); in this case, the resistance of the first element 1 will be $R_{ON}$ (positive voltage applied to its electrodes) and the resistance of the second element 4 will be $R_{OFF}$ (negative voltage applied to its electrodes). This configuration ($R_{ON}$ for the first element 1 and $R_{OFF}$ for the second element 4) corresponds to saving the logical value 1 on the output S.

Conversely, if the output S to be saved is equal to a logical zero (in other words its potential is approximately equal to the ground VSS on S); in this case, the resistance of the first element 1 will be $R_{OFF}$ (negative voltage applied to its electrodes) and the resistance of the second element 4 will be $R_{ON}$ (positive voltage applied to its electrodes). This configuration ($R_{OFF}$ for the first element 1 and $R_{ON}$ for the second element 4) corresponds to saving the logical value 0 on the output S.

Once the save operation is complete, restore mode can be triggered at any time. Therefore, the method 100a comprises a third step 103a to implement restore mode during which the most recently saved result is restored on the output S. To achieve this, during the first clock cycle:
the non-common electrode 2 of the first element 1 is polarized at a voltage equal to the reference voltage VDD, and
the non-common electrode 6 of the second element 4 is polarized at a voltage equal to zero.

For example, if the logical value equal to 1 is to be restored on output S, this means that the first element 1 has a resistance $R_{ON}$ and the second element 4 has a resistance $R_{OFF}$. In this case, the output S will "copy" the potential of MVDD (because the resistance between S and MVDD is very low) and will be approximately equal to VDD (logical value 1).

Conversely, if the logical value equal to 0 is to be restored on output S, this means that the first element 1 has a resistance $R_{OFF}$ and the second element 4 has a resistance $R_{ON}$. In this case, the output S will "copy" the potential of MVSS (because the resistance between S and MVSS is very low) and will be approximately equal to the ground VSS (logical value 0).

The function of restore mode is to restore the state saved in save mode by recreating it in the logic module M, using the resistivity state of each of the first and second elements 1 and 4 as previously saved.

Furthermore, a determined period is desired to make sure that the restore takes place. This determined period is equal to the minimum time to restore the output and for example is between 1 and 10 nanoseconds.

One of the three modes and, in an embodiment the inactive mode (see FIG. 3), is triggered during subsequent clock cycles.

Figure 4:
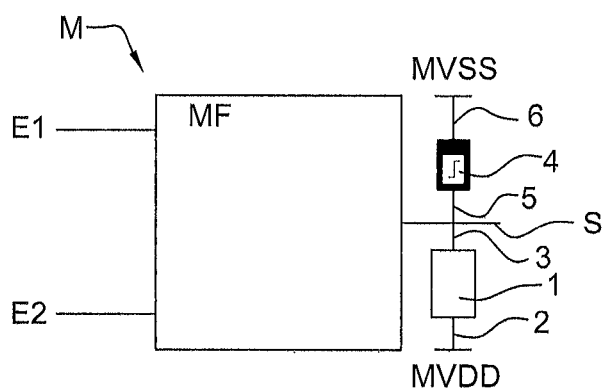
FIG. 4 diagrammatically illustrates a a logic module according to an embodiment of the invention.

FIG. 4 illustrates a third embodiment of a logic module M according to the invention.

The logic module M comprises:
a device for implementing a logic function MF, the device MF comprising two inputs E1, E2 and a single output S, representing the result of the logic function;
a first element 1 formed from a ohmic resistance comprising a first electrode 2 and a second electrode 3;
a second element 4 formed from a bipolar resistive memory comprising a third electrode 5 and a fourth electrode 6.

Furthermore, the first element 1 and the second element 4 have an electrode in common, formed by the second electrode 3 and the third electrode 5, the second electrode 3 and the third electrode 5 being connected to the output S. It should be noted that the ohmic resistance 1 and the second element 4 are arranged in series and have the same polarity sens.

Unlike the embodiment shown in FIG. 1, the ohmic resistance 1 helps to make the logic module M more compact. This resistance may for example be a poly-Si or silicon type resistance or a transistor connected as a diode or operating in linear mode.

In the remainder of this description, it is assumed that the ohmic resistance 1 carries voltage MVDD. However, it is understood that the voltage MVSS may be applied across the ohmic resistance 1 without going outside the scope of the invention.

The following conditions may be defined to perform the three operating modes (inactive, save and restore):

- a reference voltage $V_{DD}$ is defined, this reference voltage being for example between 0.6 V and 1.2 V so as to be compatible with the CMOS technology that can be used to form a device of using a logic function MF;
- $0.5 \times V_{DD} > |V_{OFF}|$, $V_{OFF}$ so that the second element 4 can be in a high resistance state;
- The resistive value of the ohmic resistance is $R_0$ $(1/q-1)*R_{T,ON}$ in which q is the error tolerated on the input to the device MF as a function of the percentage of the voltage $MV_{DD}$ such that the output signal remains correctly interpreted, and $R_{T,ON}$ is the resistance of the n-MOS of the logic module M in the conducting state. For example, if q=25%, then $R_0 > 3*R_{T,ON}$. The resistance value of $R_0$ is usually chosen to be 5 to 10 times higher than the resistive value $R_{T,ON}$ to guarantee fast operation of the logic module. However, if the objective is to minimise the leakage current, the resistive value of $R_0$ must be at least 10 to 100 times higher than the resistive value $R_{T,ON}$ and
- $R_{ON} < R0 < R_{OFF}$; this condition guarantees correct operation of restore mode.

An embodiment of the invention also relates to a method of controlling the operating mode of a logic module conforming with that illustrated in FIG. 4, to change from one operating mode to the other. The sequence of operations is illustrated by the method 100b shown in FIG. 5; the method 100b thus comprises a first step 101b for using inactive mode, during which the second element 4 is in a high resistivity state such that the second element 4 does not disturb use of the logic function. To achieve this

- a first clock cycle is triggered during which the voltage MVDD applied to the electrode 2 of the ohmic resistance 1 different from the common electrode (formed by electrodes 3 and 5) is equal to 1.5 times the reference voltage VDD and the voltage MVSS applied to the electrode 6 of the second element 4 different from the common electrode (formed by the electrodes 3 and 5) is equal to 0.5 times the reference voltage VDD;
- a second clock cycle is triggered during which the voltage MVDD is equal to 0.5 times the reference voltage VDD and the voltage MVSS is equal to −0.5 times the reference voltage VDD, and then optionally,
- a third clock cycle is triggered during which:
- the voltage MVDD is equal to the reference voltage VDD and the voltage MVSS is equal to 0, or
- the voltage MVDD, and the voltage MVSS are floating.

Inactive mode assures that the second element 4 is highly resistive, and therefore does not slow down the operation of the logic module M.

If the ohmic resistance 1 is replaced by a transistor, then the transistor is polarised moderately, in other words such that the voltage $|V_{GS}|$ applied between the transistor gate and source is between the threshold reference voltage allowable by the transistor $|V_T|$ and $(V_{DD}-|V_T|)$. In this case, the transistor can be switched off as soon as the first two clock cycles have been completed.

A larger number of clock cycles may be desirable so that the resistivity of the second element 4 is high. The number of cycles desired so that the output S changes state is then determined statically (by a statistical study of the activity ratio of all logic modules M included in the circuit (not shown) in which the logic module concerned is located or by monitoring the current that passes through the second bipolar resistive switching element 4. As long as current passes through the second bipolar resistive or switching element after a clock cycle, it is known that this element is not highly resistive. In this case, an additional clock cycle has to be triggered.

Figure 5:
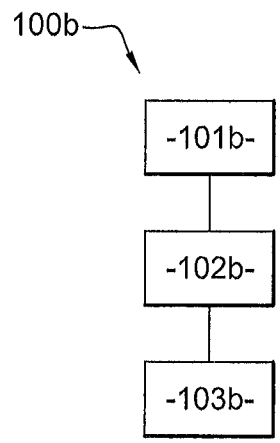
FIG. 5 illustrates a block diagram of steps in a method of controlling the operating mode of a logic module according to that illustrated in FIG. 3.

The method 100b illustrated in FIG. 5 also comprises a second step 102b to use save mode during which specific polarities are applied to the non-common electrodes of the ohmic resistance 1 and the second element 4 so that the most recent result of the logic function is saved. In an embodiment, this step 102b is triggered when it is required to switch the power supply to the module off and therefore stop the logic calculations being performed by the logic module.

During this second step 102b, the voltage MVDD applied to the non-common electrode 2 of the ohmic resistance 1 is equal to 0.5 times the reference voltage VDD and the voltage MVSS applied to the non-common electrode 6 of the second element 4 is equal to 0.5 times the reference voltage VDD.

Furthermore, a minimum duration is desired to make sure that the save takes place, after which the logic module M is switched off. This duration is equal to the minimum time to write on the second bipolar resistive switching element 4, this minimum time being of the order of one microsecond.

In general, save mode enables the second bipolar resistive switching element 4 to change its resistance state as a function of the output. Therefore, the second bipolar resistive switching element 4 follows the operation of the logic module M.

If the first element 1 is a transistor, then it is polarised in a moderate manner, in other words with a voltage $|V_{GS}|$ between the transistor gate and source between $|V_T|$ and $(V_{DD}-|V_T|)$.

Once the save operation has been done, restore mode may be triggered at any time. Therefore the method 100b includes a third step 103b to use restore mode, during which the most recently saved result is restored on output S. To achieve this:

- the non-common electrode 2 of the ohmic resistance 1 is polarised at a voltage equal to the reference voltage VDD, and
- the non-common electrode 6 of the second element 4 is polarised at a voltage equal to zero.

The purpose of restore mode is to restore the state saved in the save mode and to recreate it in the logic module M, and this is done by keeping the resistivity state of the second element 4.

One of the three modes, in an embodiment the inactive mode, is triggered during subsequent clock cycles.

Figure 6:
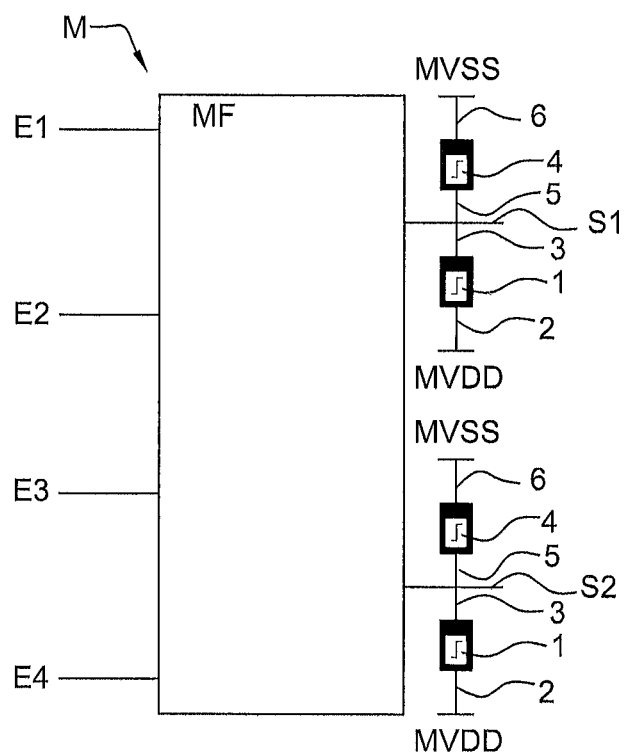
FIG. 6 diagrammatically illustrates a logic module according to an embodiment of the invention.
Figure 7:
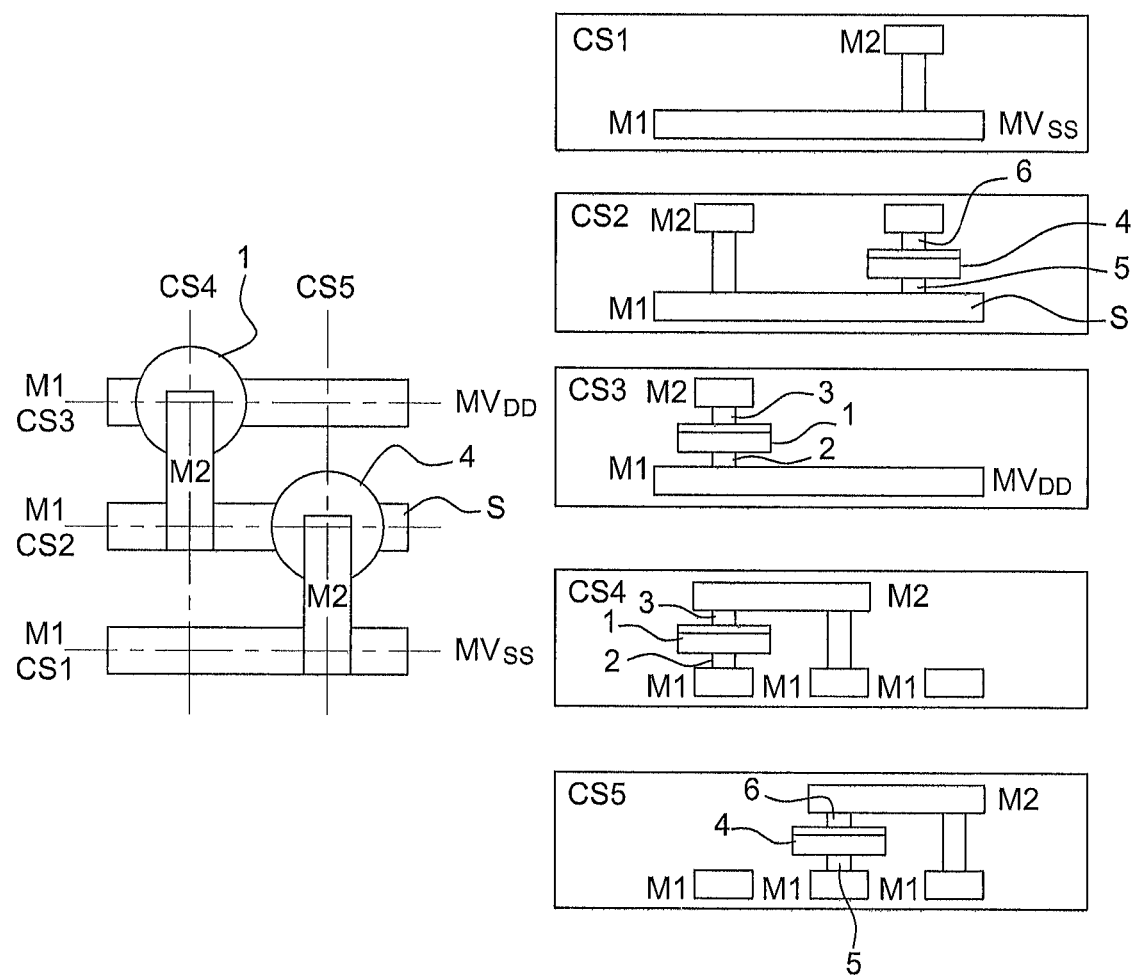
FIG. 7 illustrates a first method of making metallisation levels of a logic module according to an embodiment of the invention.
Figure 8:
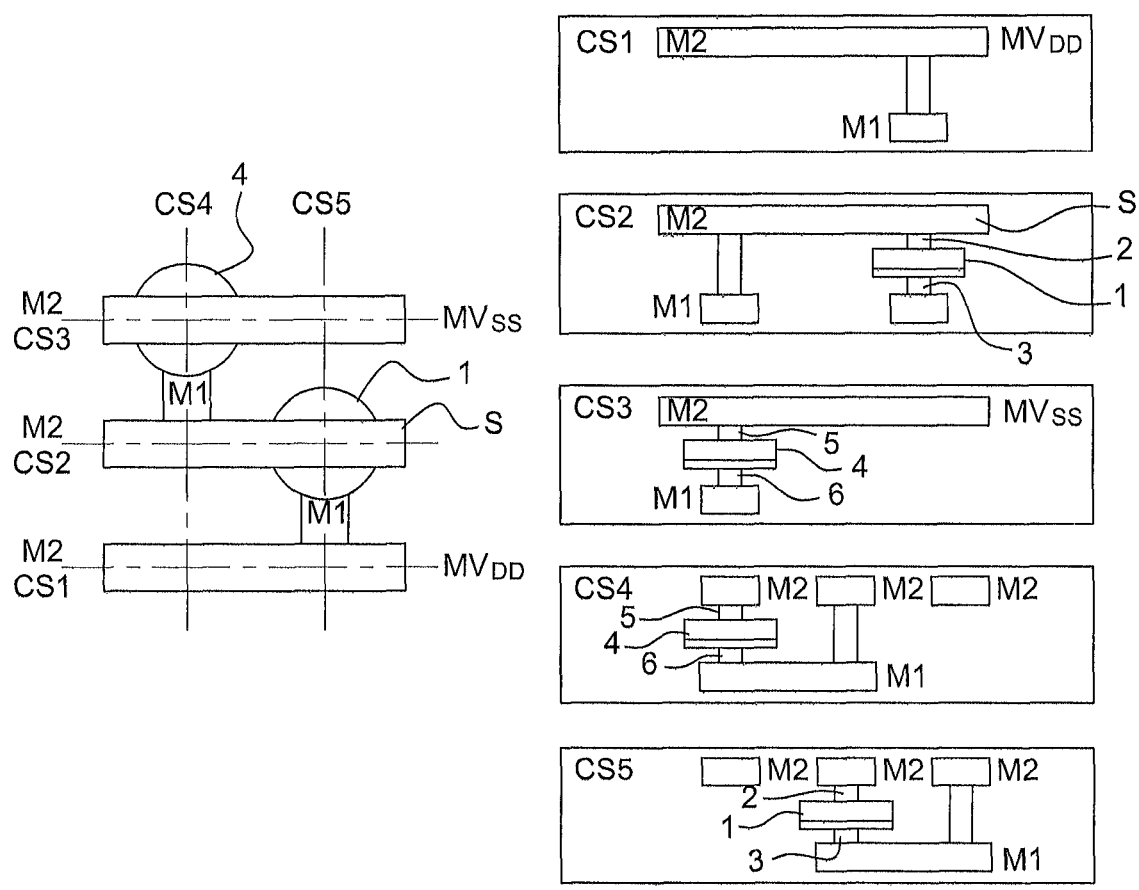
FIG. 8 illustrates a second method of making metallisation levels of a logic module according to an embodiment of the invention.

Technologically and non-limitatively, the bipolar resistive switching elements may be connected and their MVDD and MVSS power supply lines may be set according to one of the three metallisation variants illustrated in FIGS. 6, 7 and 8.

FIG. 6 shows a fourth non-limitative embodiment of a logic module M according to the invention.

The logic module M comprises:

- a device for using a logic function MF, the device MF comprising four inputs E1, E2, E3, E4 and two outputs S1, S2;
- two first elements 1, each being formed by a bipolar resistive memory comprising a first electrode 2 and a second electrode 3, and
- two second elements 4, each being formed by a bipolar resistive memory comprising a third electrode 5 and a fourth electrode 6.

It should be noted that the number of inputs and the number of outputs have been given here for purely illustrative purposes, it being clearly understood that the number of inputs may be greater than or less than 4 and the number of outputs may be greater than or less than 2.

In this example, one of the first elements and one of the second elements 4 have a common electrode formed by the second electrode 3 and the third electrode 5; the second common electrode 3 and the third common electrode 5 are also connected to an output S1 from the module MF. Note that the first element 1 and the second element 4 are arranged in series and have the same polarity sens.

Furthermore, the other of the first elements 1 and the other of the second elements 4 also have a common electrode formed by the second electrode and the third electrode 5; the second common electrode 3 and third common electrode 5 are also connected to another output S2 from the module MF. It should be noted that this other first element 1, and this other second element 4 are arranged in series, with the same polarity sens.

FIG. 7 illustrates a first embodiment of the metallisation levels of a module according to the invention. FIG. 7 comprises in particular five sectional views CS1, CS2, CS3, CS4 and CS5.

The technology used has two metallisation levels M1 and M2, the first element 1 and the second element 4 being located between the first metallisation level M1 and the second metallisation level M2, the first metallisation level M1 being the lowest metallisation level.

In this embodiment, the electrode 2 of the first element 1 different from the common electrode (formed by electrodes 3 and 5) is connected to the first metallisation level M1 onto which MVDD is also applied in this case (see sectional views CS3 and CS4 ).

Furthermore, the electrode 6 of the second element 4 different from the common electrode (formed by electrodes 3 and 5) is indirectly connected to the first metallisation level M1 on which MVSS is also applied, this connection being made through the second metallisation level M2 connected both to the electrode and to the first metallisation level M1 (see sectional view CS5).

Furthermore, the output S is also formed on the first metallisation level M1 and is connected directly to the electrode 5 (see sectional view CS2) and indirectly to the electrode 3 through the second metallisation level M2.

In this embodiment, RRAM bipolar resistive switching elements of the OxRAM type with non-soluble electrodes may be used.

The integration density is high because the two bipolar resistive switching elements are located between the first and the second metallisation levels M1 and M2.

Furthermore, this embodiment is compatible with current designs because standard logic modules are drawn down to the first metallisation level. Placement and routing are made from the second metallisation level using CAD type drawing tools. It would be possible to envisage using logic modules contained in a design library and to add the drawing of pairs of bipolar resistive switching elements to the output from the logic module contained in the library. Therefore, this would be a minimal modification to the library that does not require any high performance or expensive design tool. On the other hand, it is desired to take account of the presence of the two MVSS and MVDD rails on the second metallisation level that are additional to the VDD and VSS rails naturally present in the standard modules of the initial library.

Note that the use of an RRAM memory point with a soluble electrode (of the CBRAM type) made of silver is not compatible. On the other hand, a bipolar RRAM device of the OxRRAM type with non-soluble electrodes may be used.

FIG. 8 illustrates a second embodiment of the metallisation levels of a module according to the invention. FIG. 8 comprises five sectional views CS1, CS2, CS3, CS4 and CS5.

In this embodiment, the first element 1 and the second element 4 are located between the first metallisation level M1 and the second metallisation level M2.

The electrode 2 of the first element 1 different from the common electrode (formed by the electrodes 3 and 5) is connected to the second metallisation level M2 forming MVDD (sectional view CS2).

Furthermore, the electrode 6 of the second element 4 different from the common electrode (formed by electrodes 3 and 5) is indirectly connected to the second metallisation level M2, and in this case the second metallisation level forms MVSS. This connection is made through the first metallisation level M1 that is connected both to the electrode 6 (see sectional view CS3) and the second metallisation level M2 forming MVSS (see sectional view CS4).

Furthermore, the output S is also formed by the second metallisation level M2 and is directly connected to the electrode 2 (see sectional view CS2) and to the electrode 3 through the first metallisation level M1 that is directly connected to the electrode 5 (see sectional view CS5) and to the second metallisation level M2 forming the output S.

This variant has exactly the same benefits as those obtained by the first embodiment shown in FIG. 7.

Use of the second metallisation level M2 to set up the MVDD and MVSS lines can give a high integration density (about 25% denser).

Figure 9:
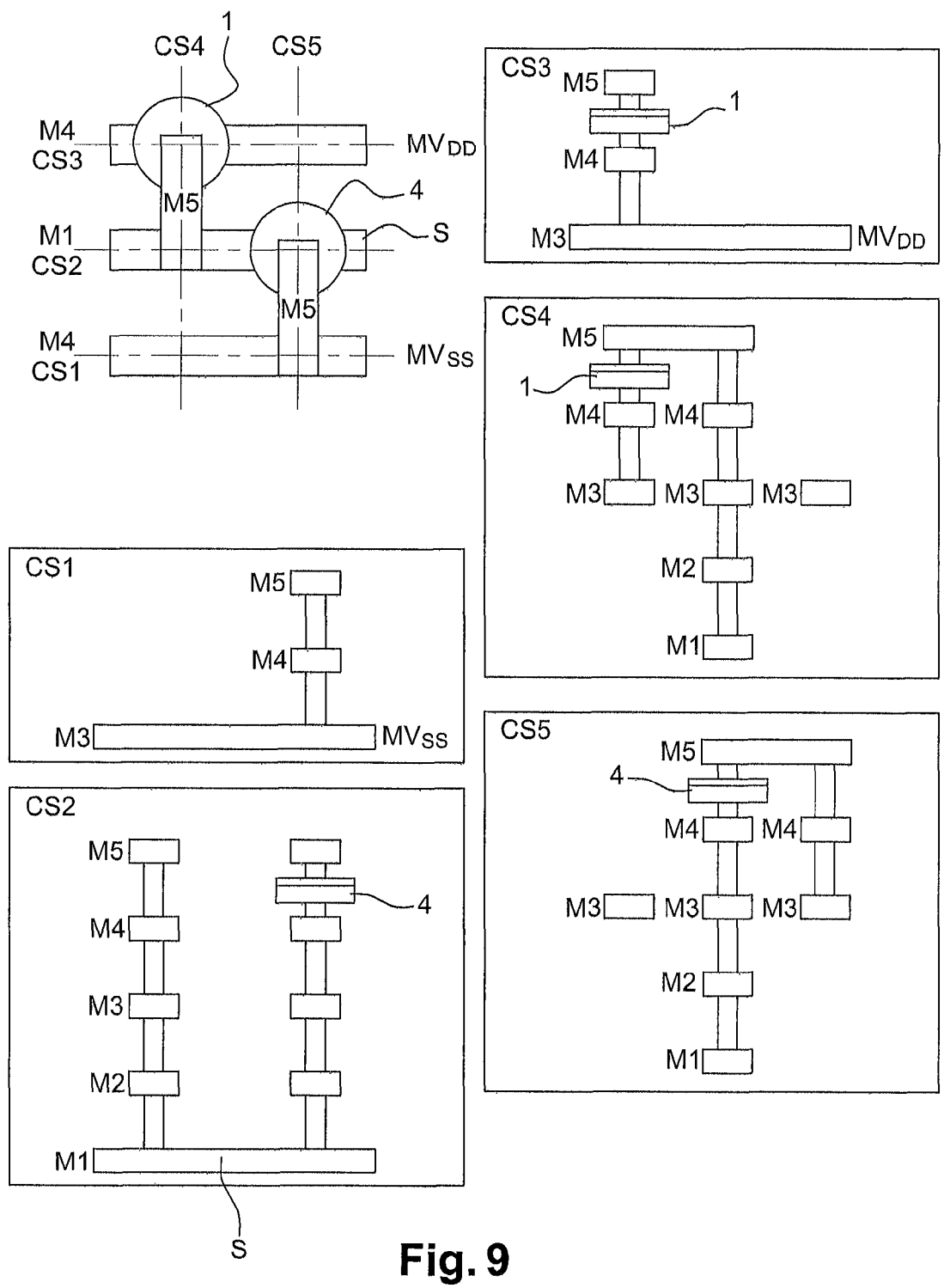
FIG. 9 illustrates a third method of making metallisation levels of a logic module according to an embodiment of the invention.

FIG. 9 shows a third embodiment of the metallisation levels of a module according to the invention. FIG. 9 comprises particularly five sectional views CS1, CS2, CS3, CS4 and CS5.

The technology used has five metallisation levels M1 to M5.

In this embodiment, the first element 1 and the second element 4 are located between the last but one metallisation level (i.e. the fourth metallisation level M4 in the example illustrated) and the last metallisation level (i.e. the fifth metallisation level M5 in the example illustrated).

In this embodiment, each bipolar resistive switching element is made before the last metallisation level so as to minimise the influence on steps to manufacture the lower interconnections used for elements of the logic circuit. In this case, CBRAM type bipolar resistive switching elements with soluble silver electrodes may be used if the manufacturing temperature of the last metallisation level M5 is limited to about 300° C.

It is clear that those skilled in the art will be capable of producing different variants of the invention, particularly concerning the layout and connection of the first and second elements 1, 4 with the metallisation levels, without going outside the scope of the invention.

It is to be understood that the present invention contemplates that, to the extent possible, one or more features of any embodiment can be combined with one or more features of any other embodiment.

The descriptions above are intended to be illustrative, not limiting. Thus, it will be apparent to one skilled in the art that modifications may be made to the invention as described without departing from the scope of the claims set out below.

The invention claimed is:
1. A logic module comprising:
a device for implementing a logic function said device comprising an input and an output, said output at least partially representing a result of the logic function;

a first element comprising a resistance state, the first element being a bipolar resistive memory, and
a second element formed by a bipolar resistive memory,
said first element and said second element having a common electrode connected to said output and said first element and said second element being arranged in series with the same polarity.

2. The logic module according to claim 1, wherein voltages applied to corresponding non-common electrodes of said first and second elements are programmed according to one or several clock cycles such that the logic module has three operating modes:
an inactive mode during which the first element and the second element are in a high resistance state, such that said first and second elements do not disturb use of the logic function;
a save mode during which the most recent result of the logic function is saved as a function of a given resistance state of said first element and said second element;
a restore mode following the save mode during which the most recently saved result is restored on said output.

3. The Logic module according to claim 1, wherein each bipolar resistive memory is chosen from among the following memories:
CBRAM memory;
bipolar OxRAM memory;
MEMS memory;
NEMS memory.

4. The logic module according to claim 1, wherein the first element and the second element are placed between a first metallisation level and a second metallisation level, the first metallisation level being the lowest metallisation level.

5. The logic module according to claim 4, wherein:
an electrode of the first element different from the common electrode is connected to the first metallisation level, said first metallisation level forming an input to a power supply line;
an electrode of the second element different from said common electrode is connected to the first metallisation level, and
said output is formed by the first metallisation level.

6. The logic module according to claim 4, wherein:
an electrode of the first element different from the common electrode is connected to the second metallisation level, said second metallisation level forming an input to a power supply line;
an electrode of the second element different from said common electrode is connected to the second metallisation level, and
said output is formed by the second metallisation level and is connected to the common electrode.

7. The logic module according to claim 1, wherein the first element and the second element are located between two intermediate or higher metallisation levels.

8. The logic module according to claim 1, comprising:
a plurality of outputs, said plurality of outputs representing the result of said logic function;
a plurality of first elements;
a plurality of second elements;
each output being connected to a common electrode of a first element and of a second element.

\* \* \* \* \*